United States Patent
Yamamoto

(10) Patent No.: US 6,686,824 B1
(45) Date of Patent: Feb. 3, 2004

(54) TOROIDAL PRINTED COIL

(75) Inventor: Kunitoshi Yamamoto, Kyoto (JP)

(73) Assignee: Nissha Printing Co., Ltd., Kyoto (JP)

( * ) Notice: Subject to any disclaimer, the term of this patent is extended or adjusted under 35 U.S.C. 154(b) by 0 days.

(21) Appl. No.: 09/463,630

(22) PCT Filed: May 28, 1999

(86) PCT No.: PCT/JP99/02815

§ 371 (c)(1),
(2), (4) Date: Jan. 28, 2000

(87) PCT Pub. No.: WO99/63557

PCT Pub. Date: Dec. 9, 1999

(30) Foreign Application Priority Data

May 29, 1998 (JP) ............................................. 10-148574
May 29, 1998 (JP) ............................................. 10-148575

(51) Int. Cl.$^7$ .............................. H01F 7/06; H01F 5/00
(52) U.S. Cl. ........................... 336/200; 29/846; 29/830; 29/605; 29/606; 29/602.1; 29/601; 336/223; 336/232
(58) Field of Search ................ 29/602.1, 606, 29/605, 846, 830, 600, 601, 603.01; 336/200, 83, 221

(56) References Cited

U.S. PATENT DOCUMENTS

| | | | |
|---|---|---|---|
| 3,372,358 A | | 3/1968 | Roy et al. |
| 4,012,703 A | * | 3/1977 | Chamberlayne .......... 333/24 R |
| 4,253,231 A | | 3/1981 | Nouet |
| 4,873,757 A | * | 10/1989 | Williams ................... 29/602.1 |
| 5,173,678 A | * | 12/1992 | Bellows et al. ............. 335/216 |
| 5,929,733 A | * | 7/1999 | Anzawa et al. .............. 336/61 |
| 6,000,128 A | * | 12/1999 | Umeno et al. ............... 29/846 |

FOREIGN PATENT DOCUMENTS

| | | |
|---|---|---|
| EP | 0 690 461 | 1/1996 |
| JP | 44-29688 | 12/1969 |
| JP | 53-88950 | 8/1978 |
| JP | 57-23208 | 2/1982 |
| JP | 57-128008 | 8/1982 |
| JP | 58-73183 | 5/1983 |
| JP | 59-103321 | 6/1984 |

* cited by examiner

*Primary Examiner*—Peter Vo
*Assistant Examiner*—Minh Trinh
(74) *Attorney, Agent, or Firm*—Wenderoth, Lind & Ponack L.L.P.

(57) ABSTRACT

A toroidal printed coil includes a plurality of annular holes (2) and a plurality of center holes (3) surrounded by the annular holes (2) in an insulating substrate (1). A plurality of annular juts (4), each comprising a portion surrounded by the annular hole (2) and the center hole (3), are formed. A printed coil sheet having a plurality of toroidal printed coils, in which a conductor film (6) is spirally formed at front-and-rear surfaces and side surfaces of annular portions (5) of the annular juts (4) with each annular portion taken as an axis, is obtained. With this printed coil sheet, a plurality of toroidal printed coils (P) are obtained by cutting the insulating substrate (1) off from the individual annular juts (4).

5 Claims, 13 Drawing Sheets

US 6,686,824 B1

TOROIDAL PRINTED COIL

FIELD OF THE INVENTION

The present invention relates to a toroidal printed coil manufacturing method as well as to a toroidal printed coil manufactured by the manufacturing method. The toroidal printed coil manufacturing method according to the present invention is suited for manufacturing a plurality of toroidal printed coils simultaneously, and a printed coil sheet to be used in the processes of the manufacturing method can also be used as a printed wiring board having a plurality of toroidal printed coils. Toroidal printed coils obtained by the present invention are used as inductance devices, antennas, solenoid coils, motor coils and the like.

BACKGROUND OF THE INVENTION

A printed coil manufacturing method according to the prior art is described with reference to FIG. 8.

There has been known a coil manufacturing method comprising the following steps. That is, as shown in FIG. 8, long, narrow and linear through slits 11, at least two in number, are formed in an insulating substrate 10 so as to be opposite to one another with a specified spacing. Metal layers are formed at front and rear surfaces of the insulating substrate 10 as well as inner surfaces of the through slits 11. The metal layers of the front and rear surfaces of the insulating substrate 10 except portions 16 forming a plurality of coil wires are removed, and the insulating substrate 10 is cut at cutting lines A, B, C, and D along the through slits 11. Then, in the cutting sections, except connection-use metal layers for individually interconnecting the metal layers of coil-wire forming portions of the front and rear surfaces of the insulating substrate 10, the metal layers of the inner surfaces of the through slits are removed. Therefore, the metal layers of the front and rear surfaces of the insulating substrate 10 are connected spirally to one another, by which coils are manufactured (Japanese Laid-Open Patent Publication No. 59-103321).

However, this m method has a large number of manufacturing steps and is complex, due to the steps of forming metal layers forming a plurality of coil wires at the front and rear surfaces of the insulating substrate as well as the inner surfaces of the through slits, then cutting the insulating substrate along the through slits, and thereafter further connecting the metal layers of the front and rear surfaces of the insulating substrate to one another spirally.

Accordingly, an object of the present invention is to solve the aforementioned issues and to provide a toroidal printed coil manufacturing method which allows toroidal printed coils to be manufactured with great simplicity without requiring much time and labor, and to provide a toroidal printed coil manufactured by this manufacturing method.

SUMMARY OF THE INVENTION

In order to achieve the above object, the present invention has the following constitutions.

According to a first aspect of the present invention, there is provided a toroidal printed coil manufacturing method for simultaneously manufacturing a plurality of toroidal printed coils including a plurality of annular holes, a plurality of center holes, and annular juts formed on an insulating substrate. The annular juts are formed of a plurality of annular portions surrounded by the plurality of annular holes and the plurality of center holes surrounded by these annular holes. Each annular portion is taken as an axis, forming a conductor film at front-and-rear surfaces and inner-and-outer side surfaces of the annular portion simultaneously and spirally.

According to a second aspect of the present invention, there is provided the toroidal printed coil manufacturing method according to the first aspect, wherein the plurality of annular holes and the plurality of center holes surrounded by these annular holes are formed in the insulating substrate prior to forming the conductor film.

According to a third aspect of the present invention, there is provided the toroidal printed coil manufacturing method according to the first or second aspect, wherein for the formation of the conductor film, after a plating resist layer is formed and patterned at portions of the front-and-rear surfaces and the inner-and-outer side surfaces other than portions to be left as the conductor film, plating process is performed so that the conductor film is formed at the portions to be left as the conductor film.

According to a fourth aspect of the present invention, there is provided the toroidal printed coil manufacturing method according to the first or second aspect, wherein for the formation of the conductor film, after the conductor film is formed generally entirely at the front-and-rear surfaces and inner-and-outer side surfaces of the annular jut, unnecessary portions of the generally entirely formed conductor film are removed by irradiation of a laser beam or the like so that the conductor film is formed at only necessary portions.

According to a fifth aspect of the present invention, there is provided the toroidal printed coil manufacturing method according to the first or second aspect, wherein for the formation of the conductor film, after the conductor film is formed generally entirely at the front-and-rear surfaces and inner-and-outer side surfaces of the annular jut, an etching resist layer is formed and patterned at portions to be left as the conductor film, unnecessary portions of the generally entirely formed conductor film are removed by etching so that the conductor film is formed at only necessary portions.

According to a sixth aspect of the present invention, there is provided the toroidal printed coil manufacturing method according to any one of the first, second, and fifth aspects, further comprising preparing a copper-clad laminate in which a copper foil is cladded on front and rear surfaces of the insulating substrate. The center holes are formed through the insulating substrate and the annular holes are formed so that the annular portion of each annularjut has a specified width and so that a portion for connecting with the other portion of the insulating substrate is left, by which the plurality of annular juts are formed. Copper plating is generally formed entirely at the front-and-rear surfaces and inner-and-outer side surfaces of the annular portion of each annular jut. Etching resist is formed congruous with the spiral conductor film with the annular portion of the annular jut taken as an axis. Unnecessary portions of the generally entirely formed conductor film are then removed, by etching, where the etching resist has not been formed. The etching resist is thereafter flaked off from the insulating substrate, by which the conductor film is obtained.

According to a seventh aspect of the present invention, there is provided the toroidal printed coil manufacturing method according to any one of the first to sixth aspects, further comprising forming terminals of start and end portions of the spiral conductor film at the connecting portion and in the same plane by etching. Portions of the coil terminal portions other than copper-foil portions are coated, with solder resist, to thereby insulate those portions, and then the connecting portion is cut, by which the plurality of toroidal printed coils are obtained.

According to an eighth aspect of the present invention, there is provided the toroidal printed coil manufacturing method according to any one of the first to seventh aspects, wherein each of the center holes is circular shaped and a perimeter of the annular portion of the annular jut has a circular shape concentric with the center hole.

According to a ninth aspect of the present invention, there is provided the toroidal printed coil manufacturing method according to any one of the first to eighth aspects, wherein each of the center holes is polygonal-shaped and a perimeter of the annular portion of the annular jut has a polygonal shape similar to the center hole.

According to a tenth aspect of the present invention, there is provided the toroidal printed coil manufacturing method according to any one of the first to ninth aspects, wherein the conductor film is uniform in width.

According to an eleventh aspect of the present invention, there is provided the toroidal printed coil manufacturing method according to any one of the first to tenth aspects, wherein the conductor film is nonuniform in width.

According to a twelfth aspect of the present invention, there is provided the toroidal printed coil manufacturing method according to any one of the first to eleventh aspects, wherein the individual annular juts are cut off from the insulating substrate, whereby the plurality of toroidal printed coils are obtained.

According to a thirteenth aspect of the present invention, there is provided a toroidal printed coil manufactured by the toroidal printed coil manufacturing method according to any one of the first to twelfth aspects.

According to a fourteenth aspect of the present invention, there is provided the toroidal printed coil manufacturing method according to the third aspect, wherein the process for patterning the plating resist layer comprises using a photo-curable photoresist film to form the plating resist layer, and exposing to light one surface of the annular portion on which a ninth mask and a light control sheet are stacked. The ninth mask behaves so as to inhibit light transmission at front-surface pattern forming portions where a conductor film of a front surface of the annular portion is to be formed with the annular portion taken as an axis, to inhibit light transmission at side-portion pattern forming portions where conductor films of outer-and-inner side surfaces of the annular portion are to be formed with the annular portion taken as an axis, and to permit light transmission at the other portions. The light control sheet behaves so as to make incident light scattered or refracted and given off from a side opposite to the incident side. The other surface of the annular portion on which a tenth mask and a light control sheet are stacked are also exposed to light. The tenth mask behaves so as to inhibit light transmission at rear-surface pattern forming portions where a conductor film of a rear surface of the annular portion is to be formed with the annular portion taken as an axis, to inhibit light transmission at side-portion pattern forming portions where conductor films of outer-and-inner side surfaces of the annular portion are to be formed with the annular portion taken as an axis, and to permit light transmission at the other portions. The light control sheet behaves so as to make incident light scattered or refracted and given off from a side opposite to the incident side, thus allowing only the exposed portions of the photoresist film to be cured. Thereafter, the photoresist film is developed to thereby remove uncured portions other than the cured portions, so that the plating resist layer is formed at each of the portions other than the portions where the conductor film of the front surface of the annular portion with the annular portion taken as an axis, the conductor film of the rear surface of the annular portion with the annular portion taken as an axis, and the conductor films of the outer-and-inner side surfaces of the annular portion with the annular portion taken as an axis are to be formed.

According to a fifteenth aspect of the present invention, there is provided the toroidal printed coil manufacturing method according to the third aspect, wherein the process for patterning the plating resist layer comprises using a photo-degradable photoresist film to form the plating resist layer, and exposing to light one surface of the annular portion on which an eleventh mask and a light control sheet are stacked. The eleventh mask behaves so as to permit light transmission at front-surface pattern forming portions where a conductor film of a front surface of the annular portion is to be formed with the annular portion taken as an axis, to permit light transmission at side-portion pattern forming portions where conductor films of outer-and-inner side surfaces of the annular portion are to be formed with the annular portion taken as an axis, and to inhibit light transmission at the other portions. The light control sheet behaves so as to make incident light scattered or refracted and given off from a side opposite to the incident side. The other surface of the annular portion on which a twelfth mask and a light control sheet are stacked are also exposed to light. The twelfth mask behaves so as to permit light transmission at rear-surface pattern forming portions where a conductor film of a rear surface of the annular portion is to be formed with the annular portion taken as an axis, to permit light transmission at side-portion pattern forming portions where conductor films of outer-and-inner side surfaces of the annular portion are to be formed with the annular portion taken as an axis, and to inhibit light transmission at the other portions. The light control sheet behaves so as to make incident light scattered or refracted and given off from a side opposite to the incident side, thus allowing only the exposed portions of the photoresist film to be photo-degraded. Thereafter, the photoresist film is developed to thereby remove only the photo-degraded portions, so that the plating resist layer is formed at each of portions other than the portions where the conductor film of the front surface of the annular portion with respect to the annular axis of the annular portion, the conductor film of the rear surface of the annular portion with respect to the annular axis of the annular portion, and the conductor films of the outer-and-inner side surfaces of the annular portion with respect to the annular axis of the annular portion are to be formed.

According to a sixteenth aspect of the present invention, there is provided the toroidal printed coil manufacturing method according to the third aspect, wherein the process for patterning the plating resist layer comprises using a photo-curable photoresist film to form the plating resist layer, and exposing to light one surface of the annular portion on which a thirteenth mask and a light control sheet are stacked. The thirteenth mask behaves so as to inhibit light transmission at front-surface pattern forming portions where either one of a conductor film of a front surface of the annular portion with the annular portion taken as an axis or a conductor film of a rear surface of the annular portion with the annular portion taken as an axis is to be formed, to inhibit light transmission at side-portion pattern forming portions where conductor films of outer-and-inner side surfaces of the annular portion are to be formed with the annular portion taken as an axis, and to permit light transmission at the other portions. The light control sheet behaves so as to make incident light scattered or refracted and given off from a side opposite to the incident side. The other surface of the annular portion on which a fourteenth mask and a light control sheet are stacked are also exposed to light. The fourteenth mask behaves so as to inhibit light transmission at rear-surface pattern forming portions where either the other one of the conductor film of the front surface of the annular portion with the annular portion taken as an axis or the conductor film of the rear surface of the annular portion with the annular portion taken as an axis is to be formed, to inhibit light transmission at a portion which is to be laid on the annular hole or center hole, and to permit light transmission at the other portions, thus allowing only the exposed portions of the photoresist film to be cured. Thereafter, the photoresist film is developed to thereby remove uncured portions other than the cured portions, so that the plating resist layer is formed at each of portions other than the portions where the conductor film of the front surface of the annular portion with the annular portion taken as an axis, the conductor film of the rear surface of the annular portion with the annular portion taken as an axis, and the conductor films of the outer-and-inner side surfaces of the annular portion with the annular portion taken as an axis are to be formed.

According to a seventeenth aspect of the present invention, there is provided the toroidal printed coil manufacturing method according to the third aspect, wherein the process for patterning the plating resist layer comprises using a photo-degradable photoresist film to form the plating resist layer, and exposing to light one surface of the annular portion on which a fifteenth mask and a light control sheet are stacked. The fifteenth mask behaves so as to permit light transmission at front-surface pattern forming portions where either one of a conductor film of a front surface of the annular portion with the annular portion taken as an axis or a conductor film of a rear surface of the annular portion with the annular portion taken as an axis is to be formed, to permit light transmission at side-portion pattern forming portions where a conductor film of an outer side surface or inner side surface of the annular portion is to be formed with the annular portion taken as an axis, and to inhibit light transmission at the other portions. The light control sheet behaving so as to make incident light scattered or refracted and given off from a side opposite to the incident side. The other surface of the annular portion on which a sixteenth mask and a light control sheet are stacked are also exposed to light. The sixteenth mask behaves so as to permit light transmission only at pattern forming portions where either the other one of the conductor film of the front surface of the annular portion with the annular portion taken as an axis or the conductor film of the rear surface of the annular portion with the annular portion taken as an axis is to be formed, and to inhibit light transmission at the other portions, thus allowing only the exposed portions of the photoresist film to be photo-degraded. Thereafter, the photoresist film is developed to thereby remove only the photo-degraded portions, so that the plating resist layer is formed at each of portions other than the portions where the conductor film of the front surface of the annular portion with the annular portion taken as an axis, the conductor film of the rear surface of the annular portion with the annular portion taken as an axis, and the conductor film of the outer side surface or inner side surface of the annular portion with the annular portion taken as an axis are to be formed.

According to an eighteenth aspect of the present invention, there is provided the toroidal printed coil manufacturing method according to the fifth aspect, wherein the process for patterning the etching resist layer comprises using a photo-curable photoresist film to form the etching resist layer, and exposing to light one surface of the annular portion on which a first mask and a light control sheet are stacked. The first mask behaves so as to permit light transmission at front-surface pattern forming portions where a conductor film of a front surface of the annular portion is to be formed with the annular portion taken as an axis, to permit light transmission at side-portion pattern forming portions where a conductor film of an outer side surface or inner side surface of the annular portion is to be formed with the annular portion taken as an axis, and to inhibit light transmission at the other portions. The light control sheet behaves so as to make incident light scattered or refracted and given off from a side opposite to the incident side. The other surface of the annular portion on which a second mask and a light control sheet are stacked is also exposed to light. The second mask behaves so as to permit light transmission at rear-surface pattern forming portions where a conductor film of a rear surface of the annular portion is to be formed with the annular portion taken as an axis, to permit light transmission at side-portion pattern forming portions where a conductor film of an outer side surface or inner side surface of the annular portion is to be formed with the annular portion taken as an axis, and to inhibit light transmission at the other portions. The light control sheet behaves so as to make incident light scattered or refracted and given off from a side opposite to the incident side, thus allowing only the exposed portions of the photoresist film to be cured. Thereafter, the photoresist film is developed to thereby remove uncured portions other than the cured portions, so that the etching resist layer is formed at each of portions where the conductor film of the front surface of the annular portion with the annular portion taken as an axis, the conductor film of the rear surface of the annular portion with the annular portion taken as an axis, and the conductor film of the outer side surface or inner side surface of the annular portion with the annular portion taken as an axis are to be formed.

According to a nineteenth aspect of the present invention, there is provided the toroidal printed coil manufacturing method according to the fifth aspect, wherein the process for patterning the etching resist layer comprises using of a photo-degradable photoresist film to form the etching resist layer, and exposing to light one surface of the annular portion on which a third mask and a light control sheet are stacked. The third mask behaves so as to inhibit light transmission at front-surface pattern forming portions where a conductor film of a front surface of the annular portion is to be formed with the annular portion taken as an axis, to inhibit light transmission at side-portion pattern forming portions where a conductor film of an outer side surface or inner side surface of the annular portion is to be formed with the annular portion taken as an axis, and to permit light transmission at the other portions. The light control sheet behaves so as to make incident light scattered or refracted and given off from a side opposite to the incident side. The other surface of the annular portion on which a fourth mask and a light control sheet are stacked is also exposed to light. The fourth mask behaves so as to inhibit light transmission at rear-surface pattern forming portions where a conductor film of a rear surface of the annular portion is to be formed with the annular portion taken as an axis, to inhibit light transmission at side-portion pattern forming portions where a conductor film of an outer side surface or inner side surface of the annular portion is to be formed with the annular portion taken as an axis, and to permit light transmission at the other portions. The light control sheet behaves so as to make incident light scattered or refracted and given off from a side opposite to the incident side, thus allowing only the exposed portions of the photoresist film to be photo-degraded. Thereafter, the photoresist film is developed to thereby remove only the photo-degraded portions, so that the etching resist layer is formed at each of portions where the conductor film of the front surface of the annular portion with the annular portion taken as an axis, the conductor film of the rear surface of the annular portion with the annular portion taken as an axis, and the conductor film of the outer side surface or inner side surface of the annular portion with the annular portion taken as an axis are to be formed.

According to a twentieth aspect of the present invention, there is provided the toroidal printed coil manufacturing method according to the fifth aspect, wherein the process for patterning the etching resist layer comprises using, a photo-curable photoresist film to form the etching resist layer, and exposing to light one surface of the annular portion on which a fifth mask and a light control sheet are stacked. The fifth mask behaves so as to permit light transmission at front-surface pattern forming portions where either one of a conductor film of a front surface of the annular portion with the annular portion taken as an axis or a conductor film of a rear surface of the annular portion with the annular portion taken as an axis is to be formed, to permit light transmission at side-portion pattern forming portions where a conductor film of an outer side surface or inner side surface of the annular portion is to be formed with the annular portion taken as an axis, and to inhibit light transmission at the other portions. The light control sheet behaves so as to make incident light scattered or refracted and given off from a side opposite to the incident side. The other surface of the annular portion on which a sixth mask is stacked is also exposed to light. The sixth mask behaves so as to permit light transmission at rear-surface pattern forming portions where either the other one of the conductor film of the front surface of the annular portion with the annular portion taken as an axis or the conductor film of the rear surface of the annular portion with the annular portion taken as an axis is to be formed, and to inhibit light transmission at the other portions, thus allowing only the exposed portions of the photoresist film to be cured. Thereafter, the photoresist film is developed to thereby remove uncured portions other than the cured portions, so that the etching resist layer is formed at each of portions where the conductor film of the front surface of the annular portion with the annular portion taken as an axis, the conductor film of the rear surface of the annular portion with the annular portion taken as an axis, and the conductor film of the outer side surface or inner side surface of the annular portion with the annular portion taken as an axis are to be formed.

According to a twenty-first aspect of the present invention, there is provided the toroidal printed coil manufacturing method according to the fifth aspect, wherein the process for patterning the etching resist layer comprises using a photo-degradable photoresist film to form the etching resist layer, and exposing to light one surface of the annular portion on which a seventh mask and a light control sheet are stacked. The seventh mask behaves so as to inhibit light transmission at front-surface pattern forming portions where either one of a conductor film of a front surface of the annular portion with the annular portion taken as an axis or a conductor film of a rear surface of the annular portion with the annular portion taken as an axis is to be formed, to inhibit light transmission at side-portion pattern forming portions where a conductor film of an outer side surface or inner side surface of the annular portion is to be formed with the annular portion taken as an axis, and to permit light transmission at the other portions. The light control sheet behaves so as to make incident light scattered or refracted and given off from a side opposite to the incident side. The other surface of the annular portion on which an eighth masks stacked is also exposed to light. The eighth mask behaves so as to inhibit light transmission at lead pattern forming portions where either the other one of the conductor film of the front surface of the annular portion with the annular portion taken as an axis or the conductor film of the rear surface of the annular portion with the annular portion taken as an axis is to be formed, to inhibit light transmission at a portion which is to be laid on a through hole, and to permit light transmission at the other portions, thus allowing only the exposed portions of the photoresist file to be photo-degraded. Thereafter, the photoresist film is developed to thereby remove only the photo-degraded portions, so that the etching resist layer is formed at each of portions where the conductor film of the front surface of the annular portion with the annular portion taken as an axis, the conductor film of the rear surface of the annular portion with the annular portion taken as an axis, and the conductor film of the outer side surface or inner side surface of the annular portion with the annular portion taken as an axis are to be formed.

BRIEF DESCRIPTION OF DRAWINGS

These and other aspects and features of the present invention will become clear from the following description taken in conjunction with the preferred embodiments thereof with reference to the accompanying drawings, in which.

DETAILED DESCRIPTION OF THE INVENTION

Figure 1:
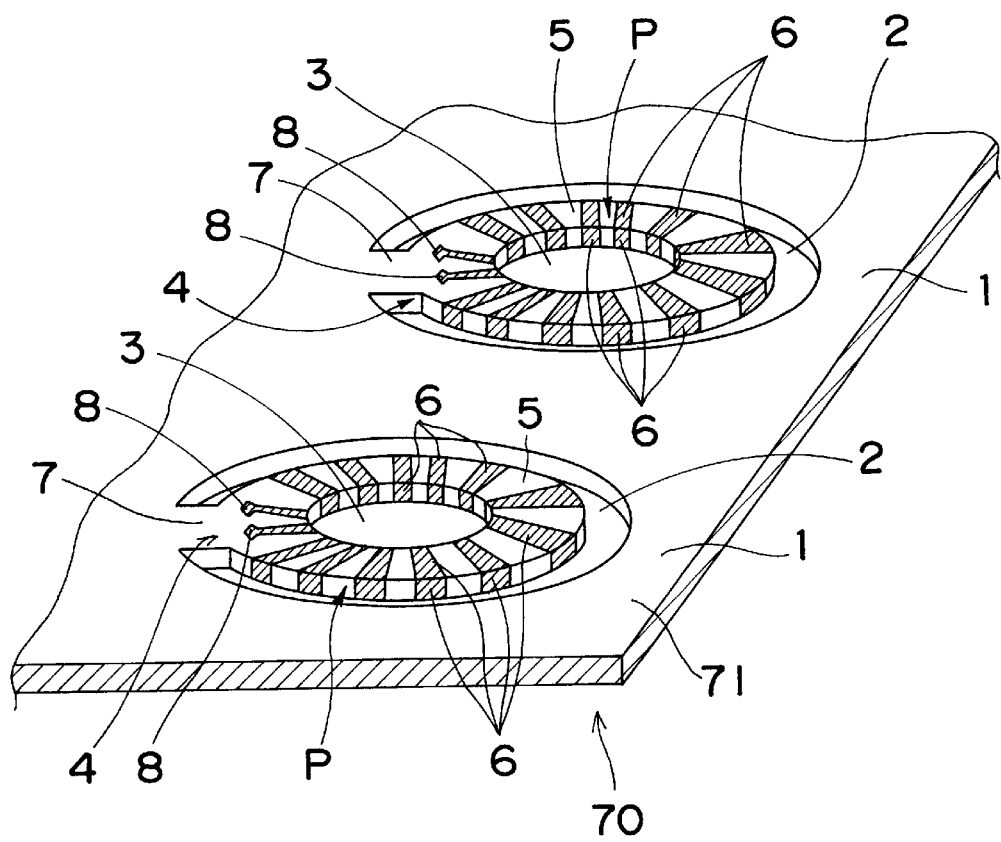
FIG. 1 is a partial perspective view showing a printed coil sheet used for the toroidal printed coil manufacturing method according to a first embodiment of the present invention.

Before the description of the present invention proceeds, it is to be noted that like parts are designated by like reference numerals throughout the accompanying drawings.

Now a first embodiment of the present invention is described in detail with reference to the accompanying drawings.

A toroidal printed coil and its manufacturing method according to an embodiment of the present invention, as well as a toroidal printed coil manufactured by the manufacturing method are described below in detail with reference to the accompanying drawings.

Figure 2:
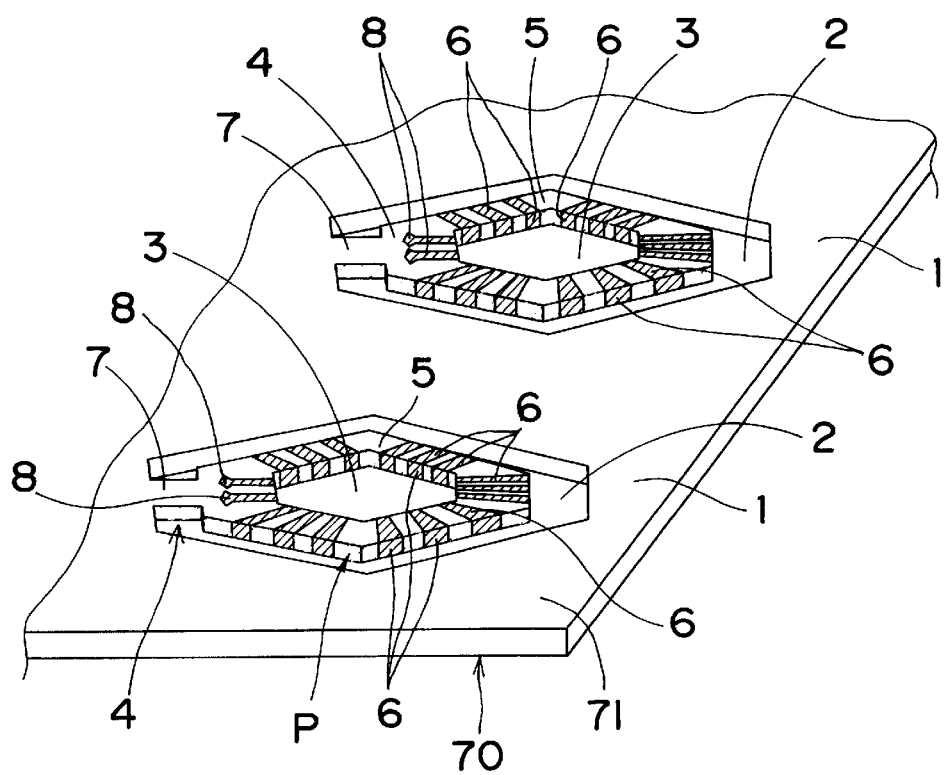
FIG. 2 is a partial perspective view showing a printed coil sheet used for the toroidal printed coil as well as its manufacturing method of the first embodiment of the present invention.
Figure 3:
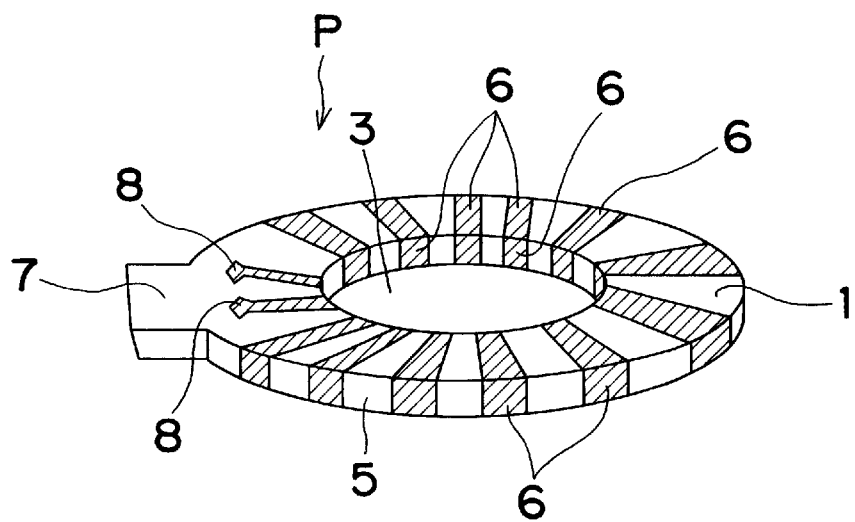
FIG. 3 is a perspective view of a toroidal printed coil cut out from the printed coil sheet shown in FIG. 1.
Figure 4:
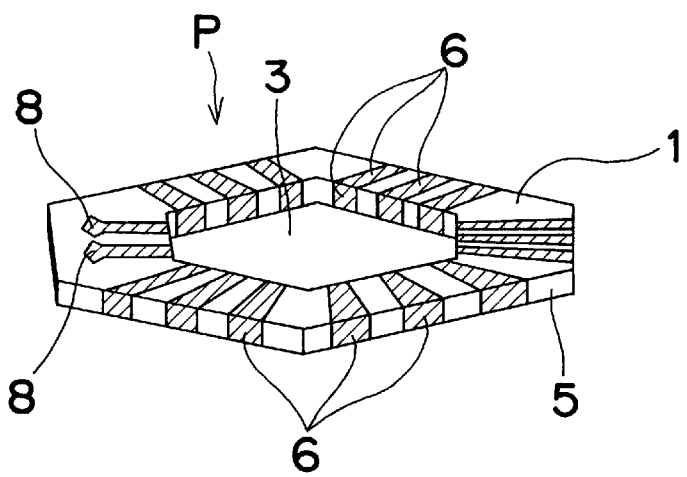
FIG. 4 is a perspective view of a toroidal printed coil cut out from the printed coil sheet shown in FIG. 2.

FIGS. 1 and 2 are partial perspective views of printed coil sheets 70 to be used for toroidal printed coil manufacturing methods according to the first embodiment and a second embodiment of the present invention, respectively. FIGS. 3 and 4 are perspective views of toroidal printed coils P cut out from the printed coil sheets 70 used for the toroidal printed coil manufacturing methods of the first embodiment and the second embodiment shown in FIG. 1 and FIG. 2, respectively.

In the figures, reference numeral 1 denotes an insulating substrate, 2 denotes a generally C-shaped annular hole formed through the insulating substrate 1, 3 denotes a circular (FIG. 1) or hexagonal (FIG. 2) center hole formed through the insulating substrate 1, 4 denotes an annular jut formed by the annular hole 2 and the center hole 3, 5 denotes an annular portion of the annular jut 4, 6 denotes a conductor film formed spirally at front-and-rear surfaces and inner-and-outer side surfaces of the annular portion 5, 7 denotes a connecting portion for connecting the annular portion 5 of the annular jut 4 and the portion (i.e., base portion) other than the annular jut 4 to each other, 8 denotes two terminals of the conductor film 6 formed in the annular portion 5 near the connecting portion 7, and P denotes a toroidal printed coil. The first embodiment and the second embodiment have the same basic construction, only differing from each other in the configurations of the annular hole 2, the center hole 3, and the annular portion 5, and therefore are described in combination.

Figure 7:
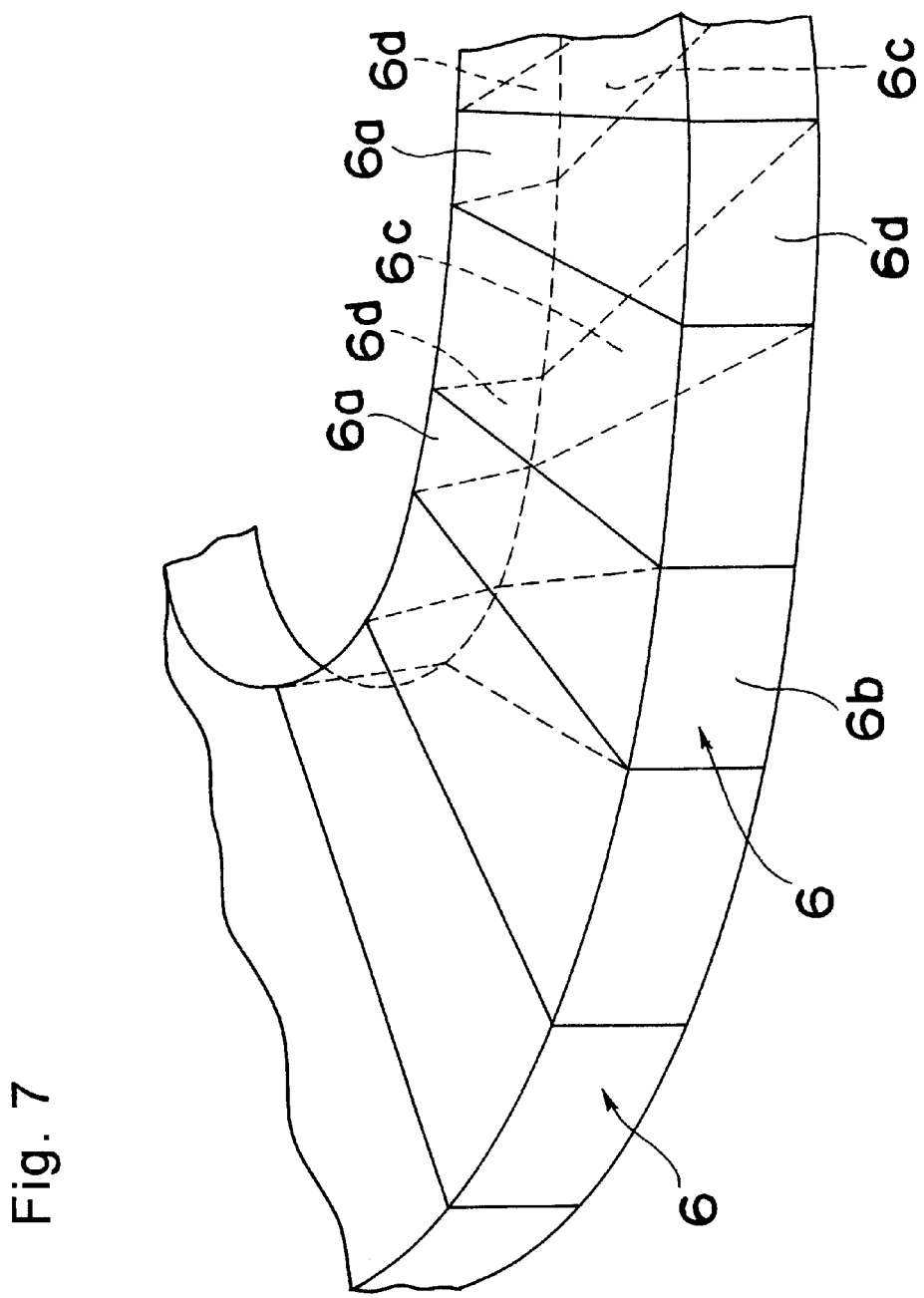
FIG. 7 is an explanatory view for explaining a state in which the conductor film is formed into a spiral shape.

For the toroidal printed coil manufacturing methods of the first and second embodiments of FIGS. 1 and 2, the printed coil sheet 70 is formed so that a plurality of annular holes 2 and a plurality of center holes 3 surrounded by these annular holes 2 are provided in and through the insulating substrate 1, and each annular jut 4 is defined by an annular hole 2 and a center hole 3 placed inside the annular hole 2 with a specified spacing. Then, in this printed coil sheet 70, with the annular portion 5 of each annular jut 4 taken as an axis, the strip-shaped conductor film 6 is formed continuously in a spiral shape at front-and-rear surfaces and inner-and-outer side surfaces of the annular portion 5 so as to be wrapped helically around annular portion 5 with respect to the annular axis of the annular portion 5 as shown in FIG. 7, by which a plurality of toroidal printed coils P are formed simultaneously. That is, referring to FIG. 7, a conductor film 6a of the front surface of the annular portion 5 is formed so as to be connected to a conductor film 6b of the outer side surface of the annular portion 5, a conductor film 6c of the rear surface of the annular portion 5, and a conductor film 6d of the inner side surface of the annular portion 5, continuously in this order, where the conductor film 6d of the inner side surface of the annular portion 5 is connected to a conductor film 6a adjacent to the foregoing conductor film 6a of the front surface of the annular portion 5. As a result of this, the continuous conductor film strip 6 is formed spirally around the annular portion 5.

As the insulating substrate 1, those sheets having insulative property at the front-and-rear surfaces and all the side surfaces are usable, exemplified by laminated sheets of paper base phenolic resin, paper base epoxy resin, synthetic-fiber-fabric base epoxy resin, glass-cloth paper composite epoxy resin, glass-cloth and glass-nonwoven-fabric composite epoxy resin, glass-cloth base epoxy resin, and glass-cloth base Teflon resin; or resins such as polyetherimide resin, polysulfone resin, polyether sulfone resin, benzocyclobutene resin, and Teflon resin; or ceramics such as aluminum nitride, silicon carbide, and alumina. In addition, the form of the insulating substrate 1 may be plate-shaped, sheet-shaped, or film-shaped.

Each of the annular juts 4 comprises an annular portion 5, which is an annular portion sandwiched between one annular hole 2 and one center hole 3 surrounded by this annular hole 2, and a connecting portion 7 for connecting the annular portion 5 and the base portion 71 of the printed coil sheet 70 to each other. As each annular jut 4 of the printed coil sheet 70 in the first embodiment of FIG. 1, the center hole 3 is circular shaped and the perimeter profile of the annular jut 4 has a circular shape concentric with the circular shape of the center hole 3 (see FIG. 1). Also, as each annular jut 4 of the printed coil sheet 70 in the second embodiment of FIG. 2, the center hole 3 is polygonal shaped, for example, hexagonal shaped, and the perimeter profile of the annular jut 4 has a polygonal shape, e.g. hexagonal shape, corresponding to the polygonal shape of the center hole 3 (see FIG. 2).

Figure 6:
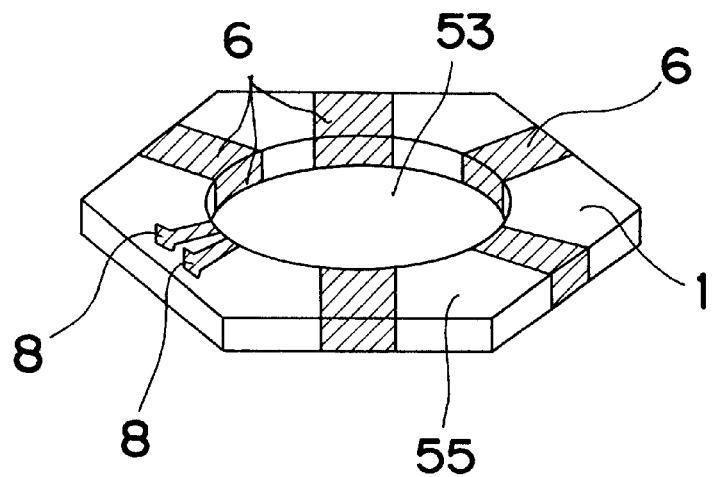
FIG. 6 is a perspective view of a toroidal printed coil manufactured by a toroidal printed coil and its manufacturing method of still another embodiment of the present invention.

As another example of the annular jut 4, it is also possible that, as shown in FIG. 6, a center hole 43 is circular shaped and the perimeter profile of an annular portion 45 of the annular jut 4 is polygonal shaped.

Figure 5:
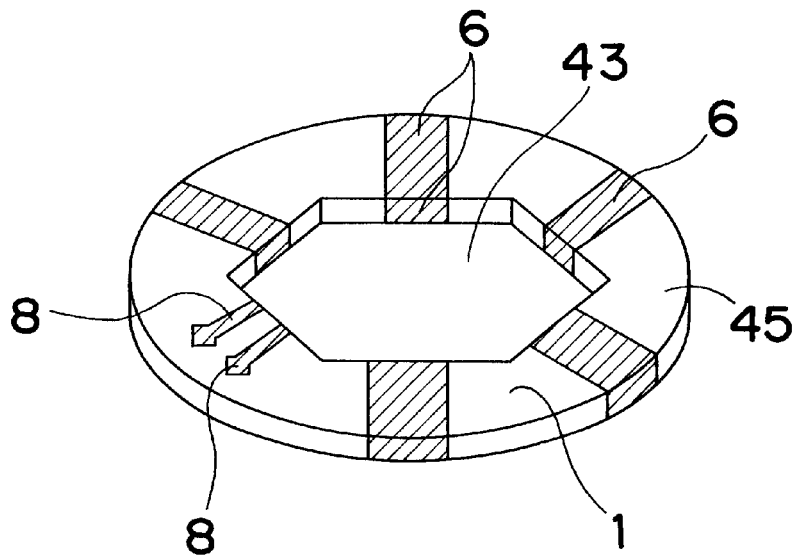
FIG. 5 is a perspective view of a toroidal printed coil manufactured by a toroidal printed coil and its manufacturing method of another embodiment of the present invention.

As yet another example of the annular jut 4, it is also possible that, as shown in FIG. 5, a center hole 53 is polygonal shaped, e.g. hexagonal shaped, and the perimeter profile of an annular portion 55 of the annular jut 4 is circular shaped.

As still another example of the annular jut 4, it is also possible that the center hole 3 is elliptical shaped and the perimeter of the annular jut 4 has an elliptical shape similar to the center hole.

The sizes and shapes of the annular hole 2 and the center hole 3 as well as of the annular jut 4 formed by these are not particularly limited and may be selected as appropriate depending on applications. The shape of the annular jut 4 may be generally C-shaped or D-shaped as an example.

Usable processes for forming the annular hole 2 and the center hole 3 are, for example, press working, router working, laser processing, NC drilling or the like.

The conductor film 6 can be formed by various methods. As an example of the methods, in the front-and-rear surfaces and inner-and-outer side surfaces of the annular jut 4, a plating resist layer is formed at portions except for portions of those surfaces to be left as the conductor film 6, and then those surfaces are plated so that the conductor film 6 is formed at the portions to be left as the conductor film 6. As another example, there is a method which includes forming a conductor film generally entirely at the front-and-rear surfaces and inner-and-outer side surfaces of the annular jut 4. Then, unnecessary portions of the generally entirely formed conductor film are removed by irradiation of a laser beam or the like so that the conductor film 6 is formed only at necessary portions, or by forming an etching resist layer at portions to be left as the conductor film 6 out of the generally entirely formed conductor film and further performing an etching process to thereby remove unnecessary portions out of the generally entirely formed conductor film so that the conductor film 6 is formed only at necessary portions, thus the conductor film 6 being formed. Portions where the conductor film 6 is formed may be either the entirety or part of the perimeter of the annular jut 4.

Next, the method of patterning the conductor film 6 is explained in detail with reference to FIGS. 9 to 18. It is noted that the reference numerals used in the first and second embodiments are used also for the following description as a typical example. Further, although only either one of the first embodiment or the second embodiment is shown in some figures for simplification of the figures, it is needless today that those figures are also applicable to the other embodiments that are not shown.

Here are described four types of methods concretely.

Figure 13:
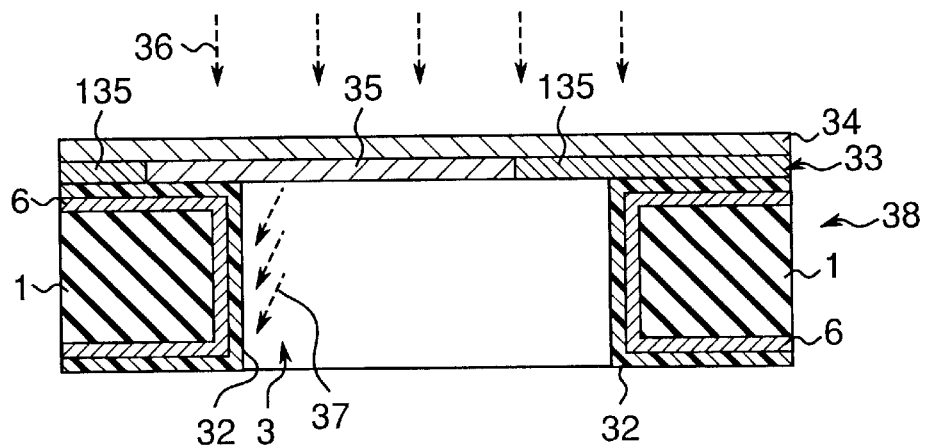
FIG. 13 is a sectional view showing a process in which part of the photoresist film is exposed to light.
Figure 14:
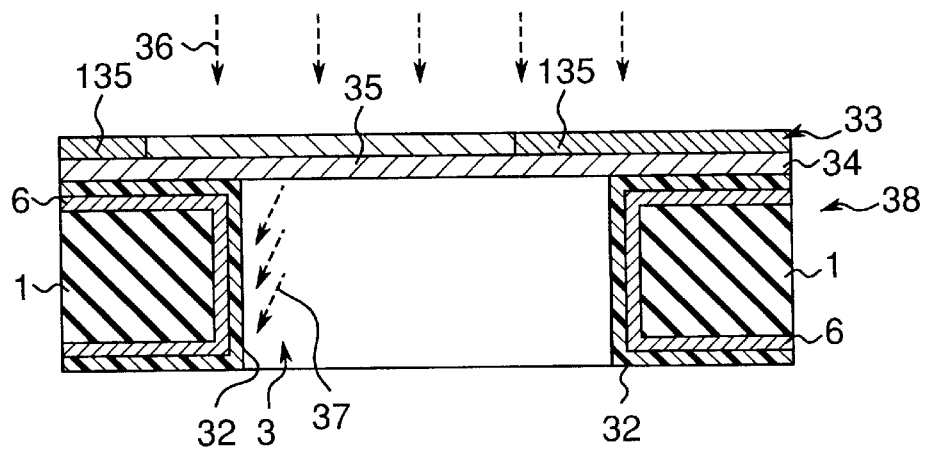
FIG. 14 is a sectional view showing a process in which part of the photoresist film is exposed to light.
Figure 15:
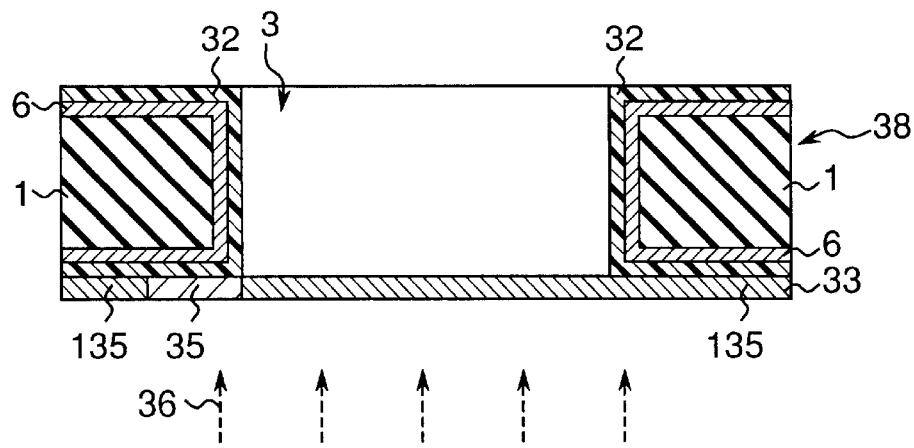
FIG. 15 is a sectional view showing a process in which part of the photoresist film is exposed to light.

First of all, a first method is a method in which, as shown in FIGS. 13 and 15, an insulating substrate 38 (which will be the insulating substrate 1 after completion) coated with a photoresist film is exposed to light one-by-one in an order of FIG. 13 and FIG. 15 or in its reverse order, where a light control sheet 34 is used for only one surface of the insulating substrate 38. In addition, a modification in which a mask 33 and the light control sheet 34 may be in a positional relation reverse to that of FIG. 13 with respect to the insulating substrate 38 is shown in FIG. 14.

Figure 16:
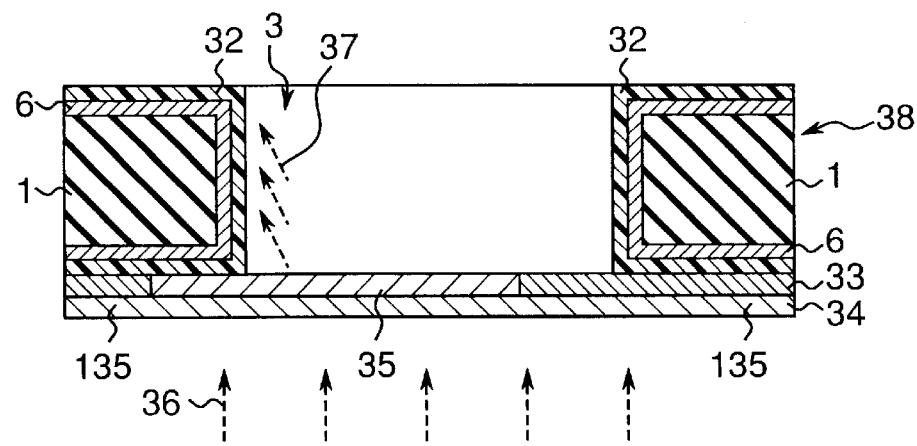
FIGS. 16 is a sectional view showing a process in which part of the photoresist film is exposed to light.

In a second method, as shown in FIGS. 13 and 16, an insulating substrate 38 coated with a photoresist film is exposed to light one-by-one in an order of FIG. 13 and FIG. 16, or in its reverse order, and the light control sheet 34 is used for both surfaces of the insulating substrate 38.

Figure 17:
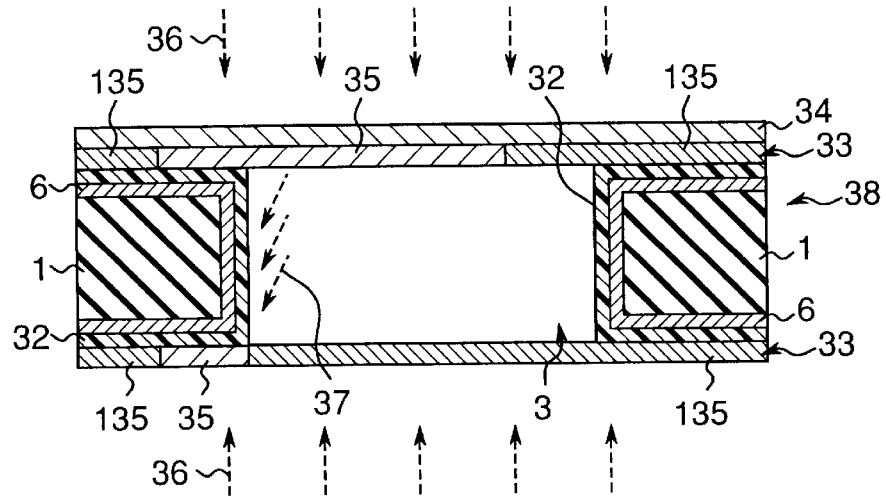
FIG. 17 is a sectional view showing a process in which part of the photoresist film is exposed to light.

In a third method, as shown in FIG. 17, an insulating substrate 38 coated with a photoresist film is exposed to light simultaneously at both surfaces, and the light control sheet 34 is used on only one surface of the insulating substrate 38.

Figure 18:
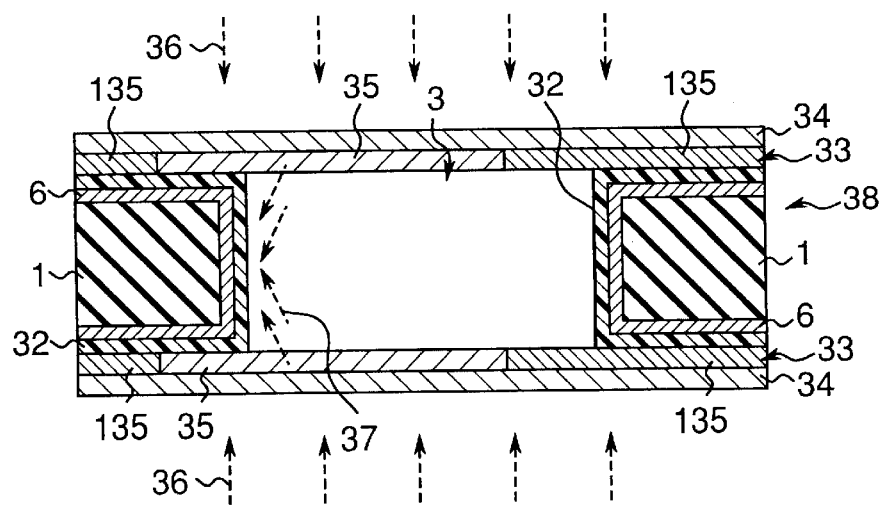
FIG. 18 is a sectional view showing a process in which part of the photoresist film is exposed to light.

In a fourth method, as shown in FIG. 18, an insulating substrate 38 coated with a photoresist film is exposed to light at both surfaces, and the light control sheets 34 are used on both surfaces of the insulating substrate 38.

More specifically, in the first method, a photoresist film 32 for forming the etching resist layer and the plating resist layer, respectively, is exposed to light in the following manner.

Figure 11:
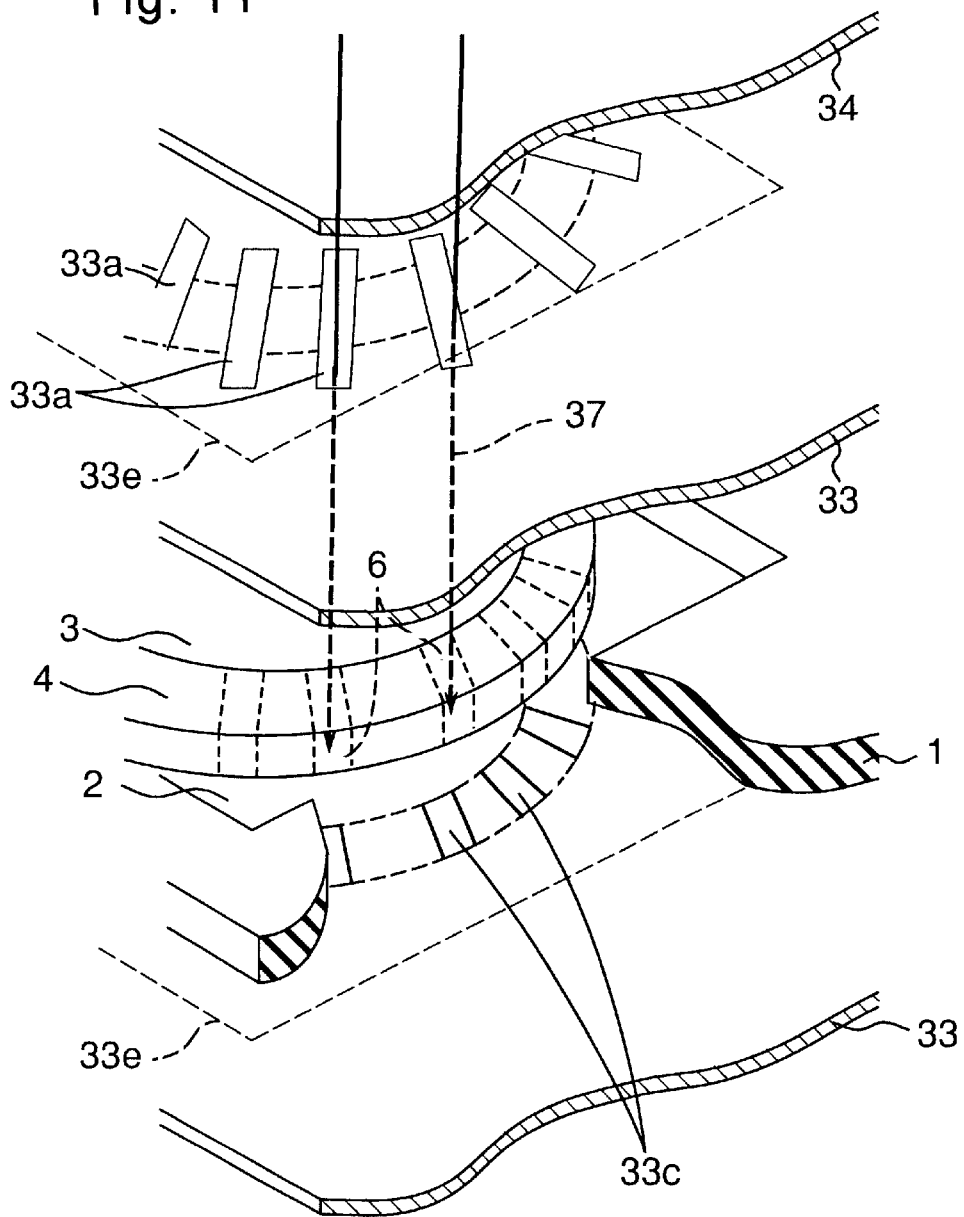
FIG. 11 is an explanatory view showing a process in which part of the photoresist film for the conductor film of the outer side surface or inner side surface of the side wall surface of the annular hole or center hole according to a toroidal printed coil of still another modification of another embodiment of the present invention is exposed to light.

First, the mask 33 and the light control sheet 34 are laid on one surface, e.g. the top surface of FIG. 11, of the insulating substrate 38, and then, as shown in FIG. 13, light is transmitted through the light control sheet 34 and light transmitting parts 35 of the mask 33 so that the photoresist film 32 is exposed to light from above downward. This mask 33 and each of masks 33 described below may be made from a glass or acrylic film sheet or the like.

Subsequently, another mask 33 is laid on the other surface, e.g. the bottom surface of FIG. 11, of the insulating substrate 38, and then, as shown in FIG. 15, light is transmitted through the light transmitting parts 35 of the mask 33 so that the photoresist film 32 is exposed to light from below upward. After that, the photoresist film 32 is developed, by which an etching resist layer or a plating resist layer having a pattern corresponding to the pattern of the mask 33 is formed.

In this first method, for the formation of the etching resist by using a photo-curable material as the photoresist film 32, as shown in FIG. 11, in the front-surface side mask 33 (upper-side mask in FIG. 11) to be located on the front surface side of the insulating substrate 1 out of two masks 33, front-surface pattern forming portions 33a formed into a pattern corresponding to a conductor film 6 (specifically a portion of film 6 corresponding to the portion 6a of FIG. 7) of the front surface of the annular portion 5 with the annular portion 5 taken as an axis, and side-portion pattern forming portions 33b which are formed into a pattern corresponding to a conductor film 6 (specifically, corresponding to the portion 6b of FIG. 7) of the outer side surface or a conductor film 6 (specifically corresponding to the portion 6d of FIG. 7) of the inner side surface of the annular portion 5 to be connected to the conductor film 6a of the front surface of the annular portion 5 with the annular portion 5 taken as an axis and which are connected to the front-surface pattern forming portions 33a these portions of the mask 33 are formed so as to be the transparent light transmitting parts 35, respectively, and the other portions are formed opaque as optical shielding parts. Therefore, the portions corresponding to the front-surface pattern forming portions 33a and the side-portion pattern forming portions 33b are the light transmitting parts 35 and transmit light, so that portions of the photoresist film 32 corresponding to the front-surface pattern forming portions 33a and the side-portion pattern forming portions 33b are exposed to light and thereby cured. The other portions do not transmit light and so are not exposed to light and are not cured. On the other hand, in the rear-surface side mask 33 (lower-side mask 33 in FIG. 11) to be located on the rear surface side of the insulating substrate 1, only rear-surface pattern forming portions 33c formed into a pattern in correspondence to the conductor film 6 (specifically corresponding to the portion 6c of FIG. 7) of the rear surface of the annular portion 5 with the annular portion 5 taken as an axis are formed so as to be the transparent light transmitting part 35, where the other portions are formed opaque as optical shielding part. Therefore, the portions corresponding to the rear-surface pattern forming portions 33c are the light transmitting parts 35 and so transmit light, so that portions of the photoresist film 32 corresponding to the rear-surface pattern forming portions 33c and the side-portion pattern forming portions 33d are exposed to light and are thereby cured. The other portions, however, do not transmit light and so are not exposed to light and not cured. As a result, in the developing process after exposure, the uncured portions are removed by a developer while the cured portions are left unremoved thereby, so that an etching resist layer is formed at portions corresponding to the conductor films 6a, 6c, 6b, 6d of the front-and-rear surfaces and inner-and-outer side surfaces of the annular portion 5 with the annular portion 5 taken as an axis. It is noted that dotted line 33e on each mask 33 in FIG. 11 represents the position where the mask is laid on the annular hole 2 or center hole 3. Also, as will be detailed later, the light control sheet 34 scatters or refracts incident light, then gives off the light from a side opposite to the incident side, so that the photoresist film 32 of the side wall surface where the conductor film 6b or 6d of the outer side portion or inner side portion of the annular portion 5 within the annular hole 2 or center hole 3 is to be formed is irradiated with the light.

Figure 12:
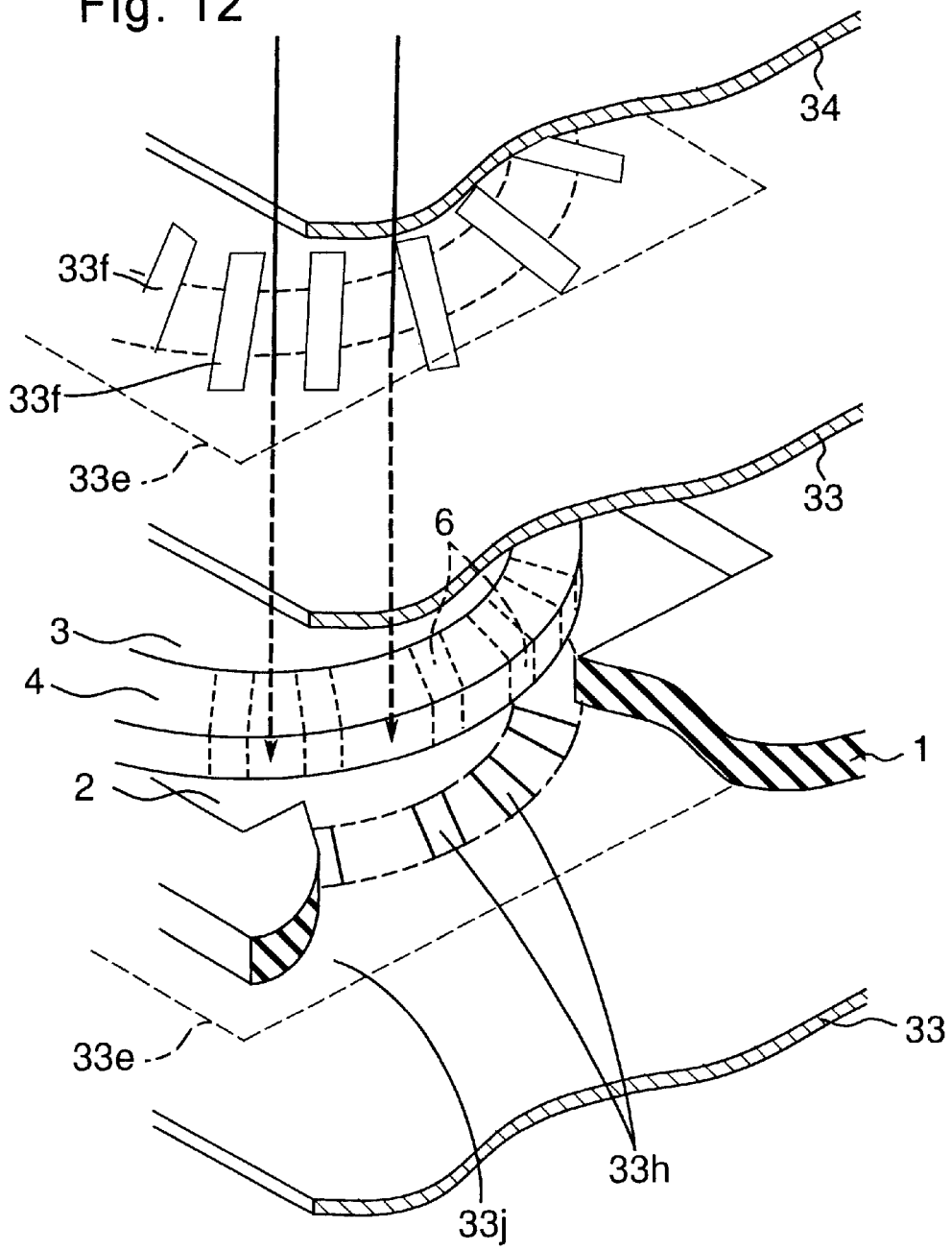
FIG. 12 is an explanatory view showing a process in which part of the photoresist film for the conductor film of the outer side surface or inner side surface of the side wall surface of the annular hole or center hole according to a toroidal printed coil of yet another modification of another embodiment of the present invention is exposed to light.

Also in the first method, for the formation of etching resist by using a photo-degradable material as the photoresist film 32, as shown in FIG. 12, in the front-surface side mask 33 (upper-side mask in FIG. 12) to be located on the front surface side of the insulating substrate 1 out of two masks 33, front-surface pattern shielding portions 33f which are formed into a pattern corresponding to the conductor film 6a of the front surface of the annular portion 5 with the annular portion 5 taken as an axis, and side-portion pattern shielding portions 33g which are formed into a pattern corresponding to the conductor film 6 of the outer side surface or the conductor film 6 of the inner-side-surface of the annular portion 5 connected to the conductor film 6a of the front surface of the annular portion 5 with the annular portion 5 taken as an axis and which are connected to the front-surface pattern shielding portions 33f are formed so as to be opaque as optical shielding parts 135, respectively, where the other portions are formed as transparent light transmitting parts 35. Therefore, the portions corresponding to the front-surface pattern shielding portions 33f and the side-portion pattern shielding portions 33g are the optical shielding parts 135 and so do not transmit light, so that portions of the photoresist film 32 corresponding to the front-surface pattern shielding portions 33f and the side-portion pattern shielding portions 33g are not exposed to light and so not degraded, while the other portions transmit light and so are degraded. On the other hand, in the rear-surface side mask 33 (lower-side mask 33 in FIG. 12) to be located on the rear surface side of the insulating substrate 1, rear-surface pattern shielding portions 33h formed into a pattern corresponding to the conductor film 6 of the rear surface of the annular portion 5 with the annular portion 5 taken as an axis, and a portion 33e to be laid on the annular hole 2 or center hole 3, are formed so as to be opaque as optical shielding parts 135, respectively. However, the other portions are formed as transparent light transmitting parts 35. Therefore, the rear-surface pattern shielding portions 33h and the portion corresponding to the portion 33e that is to be laid on the annular hole 2 or center hole 3 are the optical shielding parts 135 and so do not transmit light, so that portions of the photoresist film 32 corresponding to the rear-surface pattern shielding portions 33h are not exposed to light and so not degraded. Moreover, a wall portion corresponding to the conductor film 6b or 6d of the outer side portion or inner side portion of the annular portion 5 within the annular hole 2 or center hole of the photoresist film 32 is not exposed to light so that the portions corresponding to the side-portion pattern shielding portions 33g are not degraded, while the other portions transmit light and so are degraded. As a result, in the developing process after the exposure, the degraded portions are removed by the developer while the undegraded portions are not removed by the developer and left, so that etching resist layers are formed at portions corresponding to the conductor films 6a, 6c, 6b, 6d of the front-and-rear surfaces and inner-and-outer side surfaces of the annular portion 5 with the annular portion 5 taken as an axis. It is noted that dotted line 33e on each mask 33 in FIG. 12 represents the position where the mask is laid on the annular hole 2 or center hole 3.

Figure 9:
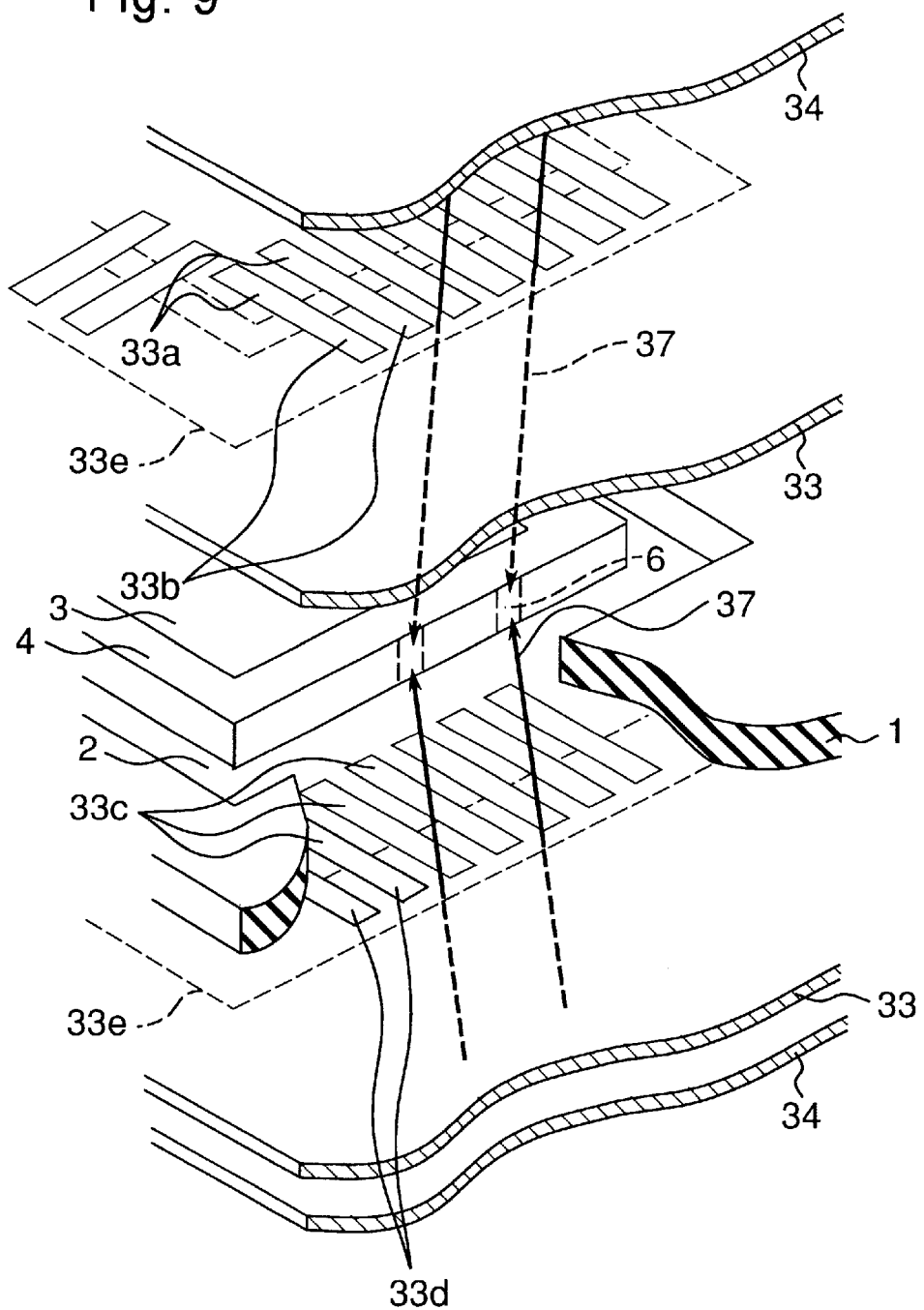
FIG. 9 is an explanatory view showing a process in which part of the photoresist film for the conductor film of the outer side surface or inner side surface of the side wall surface of the annular hole or center hole according to a toroidal printed coil of another embodiment of the present invention is exposed to light.
Figure 10:
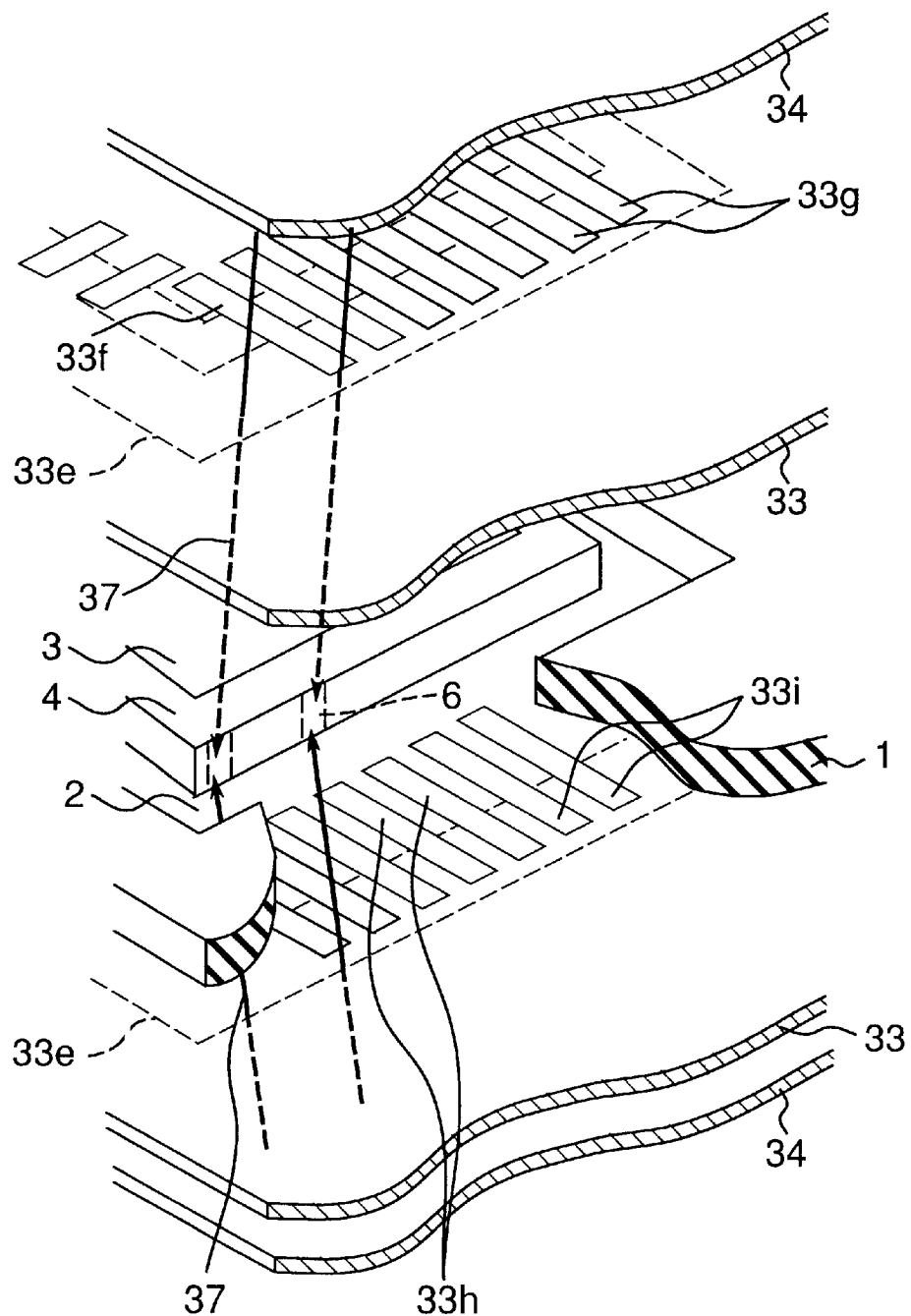
FIG. 10 is an explanatory view showing a process in which part of the photoresist film for the conductor film of the outer side surface or inner side surface of the side wall surface of the annular hole or center hole according to a toroidal printed coil of a modification of another embodiment of the present invention is exposed to light.

Next, the second method is substantially the same as the above-described first method except that when another mask 33 is laid on the other surface of the insulating substrate 38, the light control sheet 34 is also laid thereon as shown in FIG. 16, in which state the light control sheet 34 and the light transmitting part 35 of the mask 33 transmit light so that the photoresist film 32 is exposed to light from below upward, and except that the lower-side mask pattern is different from that of the first embodiment (see FIGS. 9 and 10).

In the case where the photoresist film 32 is a photocurable type of film, in the rear-surface side mask 33 (the lower-side mask 33 in FIG. 9) to be located on the rear surface side of the insulating substrate 1, the rear-surface pattern forming portions 33c formed into a pattern corresponding to the conductor film 6 of the rear surface of the annular portion 5 with the annular portion 5 taken as an axis, and the side-portion pattern forming portions 33d which are formed into a pattern corresponding to the connecting portion 7 to be connected to the conductor film 6 of the rear surface of the annular portion 5 with the annular portion 5 taken as an axis and which are connected to the rear-surface pattern forming portions 33c, are formed so as to be transparent light transmitting parts 35, respectively, while the other portions are formed as opaque optical shielding parts. Therefore, the portions corresponding to the rear-surface pattern forming portions 33c and the side-portion pattern forming portions 33d are the light transmitting parts 35 and so transmit light, so that the portions of the photoresist film 32 corresponding to the rear-surface pattern forming portions 33c and the side-portion pattern forming portions 33d are exposed to light and thereby cured, while the other portions do not transmit light and so are not cured. Also, in the case where the photoresist film 32 is a photo-degradable type, in the rear-surface side mask 33 (the lower-side mask 33 in FIG. 10) to be located on the rear surface side of the insulating substrate 1, the rear-surface pattern forming portions 33c formed into a pattern with the annular portion 5 taken as an axis and corresponding to the conductor film 6 of the rear surface of the annular portion 5, and the side-portion pattern forming portions 33d which are formed into a pattern with the annular portion 5 taken as an axis and corresponding to the connecting portion 7 connected to the conductor film 6 of the rear surface of the annular portion 5 and which are connected to the rear-surface pattern forming portions 33c, are formed opaque as the optical shielding parts 135, respectively, while the other portions are formed transparent as light transmitting parts. Therefore, the portions corresponding to the rear-surface pattern forming portions 33c and the side-portion pattern forming portions 33d are the optical shielding parts and do not transmit light, so that the portions corresponding to the rear-surface pattern forming portions 33c and the side-portion pattern forming portions 33d of the photoresist film 32 formed corresponding to the front-and-rear surfaces and inner-and-outer side surfaces of the annular portion 5 with the annular portion 5 taken as an axis are exposed to light and thereby cured, while the other portions are not exposed to light and so not cured. Also, in the case where the photoresist film 32 is a photo-degradable type, in the rear-surface side mask 33 (the lower-side mask 33 in FIG. 10) to be located on the rear surface side of the insulating substrate 1, the rear-surface pattern forming portions 33c formed into a pattern corresponding to the conductor film 6 of the rear surface of the annular portion 5 with the annular portion 5 taken as an axis, and the side-portion pattern forming portions 33d which are formed into a pattern corresponding to the connecting portion 7 to be connected to the conductor film 6 of the rear surface of the annular portion 5 with the annular portion 5 taken as an axis and which are connected to the rear-surface pattern forming portions 33c, are formed as the opaque optical shielding parts 135, respectively, while the other portions are formed as transparent light transmitting parts. Therefore, the portions corresponding to the rear-surface pattern forming portions 33c and the side-portion pattern forming portions 33d are the optical shielding parts and so do not transmit light. Therefore, portions other than the portions corresponding to the rear-surface pattern forming portions 33c and the side-portion pattern forming portions 33d of the photoresist film 32 formed at the front-and-rear surfaces and inner-and-outer side surfaces of the annular portion 5 with the annular portion 5 taken as an axis are exposed to light and thereby degraded, while the portions corresponding to the rear-surface pattern forming portions 33c and the side-portion pattern forming portions 33d are not exposed to light and are not degraded.

Next, the third method is that the steps of FIG. 13 and FIG. 15 in the first method are carried out simultaneously as shown in FIG. 17. Also, the fourth method is that the steps of FIG. 13 and FIG. 16 in the second method are carried out simultaneously as shown in FIG. 18.

In addition, the insulating substrates 38 coated with the photoresist films 32 are shown in FIGS. 9 to 12 of the first to fourth methods. However, in the case where an etching resist layer is formed, a metal layer is present between the photoresist film 32 and the insulating substrate 38 as a matter of course. Also, in the case where a plating resist layer is formed in the first to fourth methods, the masks are set with such a change that the resist layer is formed by exposure and development processes at the portions other than the conductor films 6a, 6c, 6b, 6d of the front-and-rear surfaces and inner-and-outer side surfaces of the annular portion 5 with the annular portion 5 taken as an axis.

In the first to fourth methods, the light control sheet 34 exerts control so that collimated light 36 from a light source is changed into scattered light or refracted light 37 and so that part of the resulting light is directed to the side wall surface of the conductor film 6b or 6d of the outer side portion or inner side portion of the annular portion 5 within the annular hole 2 or center hole 3 (see FIG. 13). As the light control sheet 34, for example, sheets having minute pits and projections provided on the surface like a diffusion sheet or having fine particles or air bubbles contained inside, and sheets having prismatic projections on the surface like a prism sheet are usable. Without the light control sheet 34, it would be difficult to apply the light that has been transmitted through the light transmitting part 35 of the mask 33 to the side wall surfaces of the annular hole 2 and the center hole 3, so that the patterned etching resist layer or plating resist layer of the conductor film 6b or 6d of the outer side portion or inner side portion of the annular portion 5 could not be formed at the side wall surface within the annular hole 2 or center hole 3. That is, by exposure via the light control sheet 34 and the masks 33, the etching resist layer or the plating resist layer can be formed simultaneously at the conductor films 6a, 6c, 6b, 6d of the front-and-rear surfaces and inner-and-outer side surfaces of the annular portion 5 with the annular portion 5 taken as an axis. Thus, a process cut can be realized.

Here is discussed a comparison between a case where a prisim sheet is used as the light control sheet 34 and another case where a diffusion sheet is used therefor. The prism sheet (bidirectional refractive sheet) has such a configuration that the quantity of light directed in two ways is larger than that of the diffusion sheet. Conversely, in the diffusion sheet, because light is also directed in ways other than the two ways, the quantity of light directed in two ways is smaller than the quantity of light directed by the prism sheet by the degree, resulting in less exposure. Therefore, it is preferable to use a prism sheet rather than a diffusion sheet because a relatively sharper image can be formed, when a conductor film of the outer side portion or a conductor film of the inner side portion is formed at an end face in the light-traveling direction, i.e., at the side wall surface of the annular hole 2 or center hole 3 of the substrate sheet.

The order in which the mask 33 and the light control sheet 34 are arranged for stacking may be that the light control sheet 34 is positioned lower (see FIG. 14). Light used for the exposure is given by a light source such as solar light, mercury lamp, xenon lamp, arc light, argon laser or the like. In addition, the exposure of one surface of the substrate 38 and the exposure of the other surface may be performed either simultaneously or sequentially one-by-one. Whereas FIGS. 13 and 14 show an example where an etching resist layer is formed, the conductor film 6 is omitted in the case where a plating resist layer is formed.

In the development process, in the case where the photoresist film 32 is a photo-curable type, the process is carried out by using sodium carbonate as the developer and by selectively removing uncured portions of the photoresist film 32. When the photoresist film 32 is a photo-degradable type, the developing process is carried out by using meta-silicate sodium or the like as the developer and by selectively removing photo-degraded portions of the photoresist film 32.

As the method for forming the pattern of the conductor film 6 of the outer side surface or the conductor film 6 of the inner side surface of the annular portion 5 within the annular hole 2 and the center hole 3, the method using an etching resist layer or a plating resist layer as described above is most preferable, but the conductor film 6 may be cut away by laser or other physical means.

It is also possible that the conductor film 6a of the front surface of the annular portion 5 with the annular portion 5 taken as an axis, or the conductor film 6a of the rear surface of the annular portion 5 with the annular portion 5 taken as an axis is partly insulated with solder resist. The material of the solder resist may be epoxy resin, varnish, enamel or the like. The method for forming the solder resist may be screen printing, roll coater, curtain coater, spraying, or electrostatic coating or the like.

It is also possible that the conductor film 6a of the front surface of the annular portion 5 with the annular portion 5 taken as an axis, or the conductor film 6a of the rear surface of the annular portion 5 with the annular portion 5 taken as an axis is partly or entirely surface-treated. The surface treatment may be implemented by solder leveler, gold plating, solder plating, nickel plating, silver plating, palladium plating or the like. The surface-treated layer formed by these surface treatments may be provided either as a plurality of layers in appropriate combinations, or as a single layer. As an exception, a gold-plated single layer alone will not do, and normally a gold-plated layer is stacked on a nickel-plated layer. Further, for plated layers of surface treatment, electroless plating is applicable when the conductor film is formed inside the annular hole 2 and the center hole 3.

In addition, in the masks 33, the front-surface pattern forming portions 33a are formed into a pattern corresponding to the conductor film 6a of the front surface of the annular portion 5 with the annular portion 5 taken as an axis. The side-portion pattern forming portions 33b are formed into a pattern corresponding to the conductor film 6 of the outer side surface or the conductor film 6 of the inner side surface of the annular portion 5 to be connected to the conductor film 6a of the front surface of the annular portion 5 with the annular portion 5 taken as an axis, and the side-portion pattern forming portions 33b are connected to the front-surface pattern forming portions 33a. The rear-surface pattern forming portions 33c are formed into a pattern corresponding to the conductor film 6 of the rear surface of the annular portion 5 with the annular portion 5 taken as an axis. The side-portion pattern forming portions 33d are formed into a pattern corresponding to the conductor film 6 of the outer side surface or the conductor film 6 of the inner side surface of the annular portion 5 to be connected to the conductor film 6 of the rear surface of the annular portion 5 with the annular portion 5 taken as an axis, and the side-portion pattern forming portions 33d are connected to the rear-surface pattern forming portions 33c. Howvever, the invention is not limited to this arrangement. That is, with the two masks 33 reversed in positional relation with respect-to the substrate 38, the front-surface pattern forming portions 33a may be formed into a pattern corresponding to the conductor film 6 of the rear surface of the annular portion 5 with the annular portion 5 taken as an axis. The side-portion pattern forming portions 33b are then formed into a pattern corresponding to the conductor film 6 of the outer side surface or the conductor film 6 of the inner side surface of the annular portion 5 to be connected to the conductor film 6 of the rear surface of the annular portion 5 with the annular portion 5 taken as an axis, and the side-portion pattern forming portions 33b are connected to the front-surface pattern forming portions 33a. The rear-surface pattern forming portions 33c are formed into a pattern corresponding to the conductor film 6a of the front surface of the annular portion 5 with the annular portion 5 taken as an axis. The side-portion pattern forming portions 33d are formed into a pattern corresponding to the conductor film 6 of the outer side surface or the conductor film 6 of the inner side surface of the annular portion 5 to be connected to the conductor film 6a of the front surface of the annular portion 5 with the annular portion 5 taken as an axis, and the side-portion pattern forming portions 33d are connected to the rear-surface pattern forming portions 33c.

Similarly, the front-surface pattern shielding portions 33f are formed into a pattern corresponding to the conductor film 6a of the front surface of the annular portion 5 with the annular portion 5 taken as an axis. The side-portion pattern shielding portions 33g are formed into a pattern corresponding to the conductor film 6 of the outer side surface or the conductor film 6 of the inner side surface of the annular portion 5 to be connected to the conductor film 6a of the front surface of the annular portion 5 with the annular portion 5 taken as an axis, and the side-portion pattern shielding portions 33g are connected to the front-surface pattern shielding portions 33f The rear-surface pattern shielding portions 33h are formed into a pattern corresponding to the conductor film 6 of the rear surface of the annular portion 5 with the annular portion 5 taken as an axis. However, this invention is not limited to this arrangement. That is, with the two masks 33 reversed in positional relation with respect to the substrate 38, the front-surface pattern shielding portions 33f may be formed into a pattern corresponding to the conductor film 6 of the rear surface of the annular portion 5 with the annular portion 5 taken as an axis. The side-portion pattern shielding portions 33g are then formed into a pattern corresponding to the connecting portion 7 to be connected to the conductor film 6 of the rear surface of the annular portion 5 with the annular portion 5 taken as an axis, and the side-portion pattern shielding portions 33g are connected to the front-surface pattern shielding portions 33f. The rear-surface pattern shielding portions 33h are formed into a pattern corresponding to the conductor film 6a of the front surface of the annular portion 5 with the annular portion 5 taken as an axis. Except for cases where the cutting is done by laser or other physical means, by these methods using exposure as described above, it becomes possible to expose to light, either by sequential steps or simultaneously, the conductor film 6a of the front surface of the annular portion 5 as well as the conductor film 6 of the outer side surface or the conductor film 6 of the inner side surface of the annular portion 5 with the annular portion 5 taken as an axis, and the conductor film 6 of the rear surface of the annular portion 5 with the annular portion 5 taken as an axis. In addition, by a one-time developing step, etching resist or plating resist for the conductor film 6a is formed on the front surface of the annular portion 5 as well as the conductor film 6 of the outer side surface or the conductor film 6 of the inner side surface of the annular portion 5 with the annular portion 5 taken as an axis, and for the conductor film 6 of the rear surface of the annular portion 5 with the annular portion 5 taken as an axis. Therefore, the conductor film 6a of the front surface of the annular portion 5 as well as the conductor film 6 of the outer side surface or the conductor film 6 of the inner side surface of the annular portion 5 with the annular portion 5 taken as an axis, and the conductor film 6 of the rear surface of the annular portion 5 with the annular portion 5 taken as an axis can be formed at the front-and-rear surfaces and inner-and-outer side surfaces of the annular portion 5 with the annular portion 5 taken as an axis, simultaneously by etching or plating, with high efficiency and with low price.

The material for forming the conductor film 6 may be any one which has electrical conductivity, exemplified by Such metals as copper, nickel, and gold.

The width of the conductor film 6 is not particularly limited, and normally about 0.05 mm–1 mm widths suffice. The width of the conductor film 6 may be entirely uniform of course, but also may be nonuniform. For example, with an arrangement in which the width of the conductor film 6 gradually increases along the turning direction, a wider bandwidth of frequency can be obtained.

The thickness of the conductor film 6 is also not particularly limited, and normally 3 $\mu$m–50 $\mu$m thicknesses suffice.

The number of turns of the conductor film 6 (i.e., the number of turns of the coil) is selected depending on the use of the printed coil.

In addition, surface treatment may be performed on part or all of the conductor film 6. The surface treatment in this case may be implemented by solder leveler, gold plating, solder plating, nickel plating or the like.

Further, the conductor film 6 of portions other than the portions that form the two terminals 8 of the toroidal printed coil P may be insulated with solder resist. The material of the solder resist may be epoxy resin, varnish, enamel or the like. The method for forming the solder resist may be a screen printing process, roll coater process, curtain coater process, spraying process, electrostatic coating process or the like.

In the toroidal printed coil manufacturing methods according to the first and second embodiments of the present invention, each toroidal printed coil P can be obtained only by cutting each annular jut 4 of the printed coil sheet 70 at the connecting portion 7 out of the insulating substrate 1. The cutting place for obtaining the toroidal printed coil P, without any particular limitations, may be such that the connecting portion 7 is either separated away on the toroidal printed coil P side by cutting at the boundary portion between the connecting portion 7 and the base portion 71 of the printed coil sheet 70 (see FIG. 3), or left remaining on the base portion 71 side of the printed coil sheet 70 by cutting at the boundary portion between the connecting portion 7 and the annular portion 5 (see FIG. 4).

The toroidal printed coil P cutting method for obtaining individual toroidal printed coils P from the printed coil sheet 70 may be punching press working, router working, laser cutting process, V cutting process, sheet cutting process or the like.

As shown above, in the toroidal printed coil manufacturing methods of the first and second embodiments of the present invention, the printed coil sheet 70 in which toroidal printed coils P have been formed may be used, as it is, as a printed wiring board having toroidal printed coils P. Alternatively, other circuits may be formed in the toroidal printed coils P cut at the connecting portion 7 so that the printed coil sheet 70 can be used as a printed wiring board having toroidal printed coils P.

The toroidal printed coil manufacturing method according to the present invention produces the following effects.

That is, in the toroidal printed coil manufacturing method according to the present invention, the plurality of annular holes and the plurality of center holes are formed in the insulating substrate, the annular juts are formed by a plurality of annular portions surrounded by the plurality of annular holes and the plurality of center holes surrounded by these annular holes. With each annular portion taken as an axis, the conductor film is formed at the front-and-rear surfaces and inner-and-outer side surfaces of the annular portion simultaneously and spirally, by which the plurality of toroidal printed coils are manufactured simultaneously. Therefore, in the printed coil sheet in which the plurality of toroidal printed coils have been formed in the insulating substrate, the plurality of toroidal printed coils can be obtained individually by cutting the individual annular juts off from the insulating substrate. Therefore, toroidal printed coils can be obtained extremely simply without requiring much time and labor.

Figure 8:
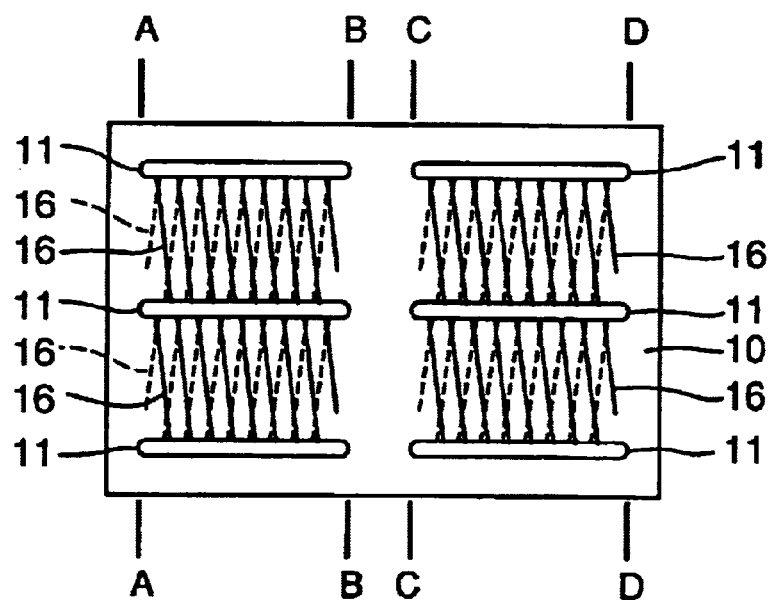
FIG. 8 is an explanatory view showing a printed coil manufacturing method according to the prior art.

In the prior art manufacturing method, because of the linear shape of the through slits 11 as shown in FIG. 8, after cutting tile insulating substrate 10 along the through slits 11 and the cutting lines A, B, C, D into so-called chips, a connection-use metal layer can be simply formed at the side surface of each chip. The reason of this is that the cutting side surface of each chip is flat so that the connection-use metal layer can be simply formed. However, in the case where toroidal printed coils are manufactured by such a method, in an attempt to form the connection-use metal layer at the side surface of each chip after cutting annular chips off from the insulating substrate 10, the conductor film, if formed by printing as an example, would inevitably be formed while the chip-form insulating substrates are rotated in various angles one by one so as to be opposed to the screen surface of the printing machine, because the inner-and-outer side surfaces of the annular chips are composite surfaces having concave curved surfaces, convex curved surfaces, or a plurality of planes of different angles of inclination. Thus, the prior art method would involve much time and labor. Furthermore, the resulting chips would be small and difficult to handle. Besides, those chips could not be finely connected to the already formed conductor film, or might be formed with a positional shift, resulting in products having resistance values other than desired values.

In contrast to this, with the present invention, before cutting into chips the annular portions each formed with combinations of concave curved surfaces, convex curved surfaces, or a plurality of planes of different angles of inclination as described above, a conductor film that is necessary as a coil is formed at all the surfaces of front surface, rear surface, and inner-and-outer side surfaces of each annular portion. Thus, all the difficulties as described above can be solved.

Working Example

A longitudinally 340 mm, laterally 255 mm copper-clad laminate in which an 18 μm thick copper foil was cladded on front and rear surfaces of a 0.2 mm thick insulating substrate 1 (glass-cloth base epoxy resin made by Matsushita Electric Works, Ltd.) was prepared. A center hole 3 having an inner diameter of 5 mm was drilled through this sheet by router working, and a 1 mm wide annular hole 2 concentric with the center hole 3 was formed so that the annular portion 5 of the annular jut 4 would be 6 mm wide. The width of the connecting portion 7 was set to 2 mm. In this one insulating substrate 1, 284 annular juts 4 were manufactured, 22 pieces longitudinally and 16 pieces laterally, with a pitch of 15 mm. Then, an 18 μm thick copper plating was formed generally entirely on the front-and-rear surfaces and inner-and-outer side surfaces of the annular portion of each annular jut 4. With the annular portion 5 of each annular jut 4 taken as an axis, etching resist congruous with the conductor film 6 was formed with a 0.2 mm width of the conductor film 6 and a 0.45 mm pitch at the inner-circumferential side surface of the annular portion 5. Next, unnecessary portions of the generally entirely formed conductor film where no etching resist was formed were removed by etching with ferric chloride. Thereafter the etching resist was flaked off, by which a conductor film 6 was obtained. Also, in the connecting portion 7, terminals at start and end portions of the coil were formed at a diameter of 0.5 mm on the same plane by etching. Further, after portions other than the copper foil portions of the coil terminal portions were coated with solder resist, the connecting portion was cut off by press, by which 294 toroidal printed coils were obtained.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A toroidal printed coil comprising:

an insulating substrate having an annular portion, a connection portion, a center hole formed in said annular portion, a base portion, and a C-shaped annular hole arranged such that said annular portion is formed between said center hole and said C-shaped annular hole, and such that said annular portion is connected to said base portion by said connection portion; and a conductor film strip formed around said annular portion of said insulating substrate in a helical manner with respect to an annular axis of said annular portion so as to form conductor film on a front surface, a rear surface, an inner surface, and an outer surface of said annular portion.

2. The toroidal printed coil of claim 1, wherein said conductor film strip has a first end terminal at a first end of said conductor film strip and a second end terminal at a second end of said conductor film strip opposite said first end, said first end terminal and said second end terminal being arranged on said connection portion.

3. The toroidal printed coil of claim 1, wherein said conductor film strip extends an entire length of said annular portion so as to surround said center hole.

4. The toroidal printed coil of claim 1, wherein an inner periphery of said annular portion and an outer periphery of said annular portion have a polygonal configuration.

5. The toroidal printed coil of claim 1, wherein a first one of an inner periphery of said annular portion and an outer periphery of said annular portion has a polygonal configuration, and a second one of said inner periphery and said outer periphery has a circular configuration.

* * * * *